(12) United States Patent
Ozeki et al.

(10) Patent No.: US 10,181,459 B2
(45) Date of Patent: Jan. 15, 2019

(54) METHOD OF MANUFACTURING LIGHT-EMITTING DEVICE

(71) Applicant: NICHIA CORPORATION, Anan-shi, Tokushima (JP)

(72) Inventors: Kenji Ozeki, Tokushima (JP); Takakazu Kono, Anan (JP); Kunihito Sugimoto, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 35 days.

(21) Appl. No.: 15/346,257

(22) Filed: Nov. 8, 2016

(65) Prior Publication Data

US 2017/0154879 A1 Jun. 1, 2017

(30) Foreign Application Priority Data

Nov. 27, 2015 (JP) ................. 2015-231202

(51) Int. Cl.
| | |
|---|---|
| *H01L 25/16* | (2006.01) |
| *H01L 33/48* | (2010.01) |
| *H01L 33/60* | (2010.01) |
| *H01L 33/62* | (2010.01) |
| *H01L 33/46* | (2010.01) |
| *H01L 29/866* | (2006.01) |

(52) U.S. Cl.
CPC ............ *H01L 25/167* (2013.01); *H01L 33/46* (2013.01); *H01L 33/483* (2013.01); *H01L 33/60* (2013.01); *H01L 33/62* (2013.01); *H01L 29/866* (2013.01); *H01L 2224/48247* (2013.01); *H01L 2224/48257* (2013.01); *H01L 2224/8592* (2013.01); *H01L 2933/0058* (2013.01); *H01L 2933/0091* (2013.01)

(58) Field of Classification Search
CPC ...... H01L 25/167; H01L 33/483; H01L 33/60
See application file for complete search history.

(56) References Cited

U.S. PATENT DOCUMENTS

| | | | |
|---|---|---|---|
| 9,728,690 B2* | 8/2017 | Ukawa | H01L 33/507 |
| 2008/0203419 A1* | 8/2008 | Harada | H01L 25/0753 257/98 |
| 2010/0220461 A1* | 9/2010 | Naijo | G02F 1/133603 362/97.1 |
| 2014/0087498 A1 | 3/2014 | Terayama et al. | |
| 2014/0151734 A1* | 6/2014 | Ito | H01L 33/58 257/98 |

FOREIGN PATENT DOCUMENTS

| | | | |
|---|---|---|---|
| JP | 2012-059921 A | | 3/2012 |
| JP | 2013-175759 A | | 9/2013 |
| JP | 2014-082453 A | | 5/2014 |
| JP | 2014-082453 | * | 8/2014 |

* cited by examiner

*Primary Examiner* — Mohammad Choudhry
(74) *Attorney, Agent, or Firm* — Foley & Lardner LLP

(57) ABSTRACT

A method of manufacturing a light-emitting device incudes providing a supporting member having a recess; disposing a light-emitting element at a bottom surface of the recess; disposing a first light-reflecting resin at the bottom surface of the recess; disposing a second light-reflecting resin in the recess, a viscosity of the second light-reflecting resin being higher than a viscosity of the first light-reflecting resin; and curing the first light-reflecting resin and the second light-reflecting resin to form a light-reflecting wall.

11 Claims, 2 Drawing Sheets

METHOD OF MANUFACTURING LIGHT-EMITTING DEVICE

CROSS-REFERENCE TO RELATED APPLICATION

The present application claims the benefit of Japanese Patent Application No. 2015-231202, filed on Nov. 27, 2015, the disclosure of which is hereby incorporated by reference in its entirety.

BACKGROUND

The present disclosure relates to a method of manufacturing a light-emitting device.

There exists a light-emitting device in which a light-emitting element is disposed at the bottom surface of a supporting member having a recess. For the purpose of achieving efficient extraction of light from the light-emitting element of such a light-emitting device, for example, a light-emitting device disclosed in JP 2014-82453 A includes a light-reflecting wall provided near a light-emitting element for reflecting light of the light-emitting element. This light-reflecting wall is formed by, for example, disposing a light-reflecting resin including a light diffusing material near the light-emitting element and curing the resin.

SUMMARY

However, in some cases, it is difficult to dispose the light-reflecting resin in all parts of the recess in which the light-emitting element is disposed with high work efficiency. When there remains any part where the light-reflecting resin is not disposed, such a part fails to reflect light. Accordingly, the light from the light-emitting element cannot be efficiently extracted outside the light-emitting device.

An objective of certain embodiments of the present invention is to provide a method of easily forming a light-reflecting wall around a light-emitting element.

A method of manufacturing a light-emitting device according to one embodiment of the present invention includes: providing a supporting member having a recess; disposing a light-emitting element at a bottom surface of the recess; disposing a first light-reflecting resin at the bottom surface of the recess; disposing a second light-reflecting resin being higher in viscosity than the first light-reflecting resin at the recess; and curing the first light-reflecting resin and the second light-reflecting resin to form a light-reflecting wall.

According to such a method of manufacturing a light-emitting device, a light-reflecting wall can be easily formed around a light-emitting element.

DETAILED DESCRIPTION

Figure 1:
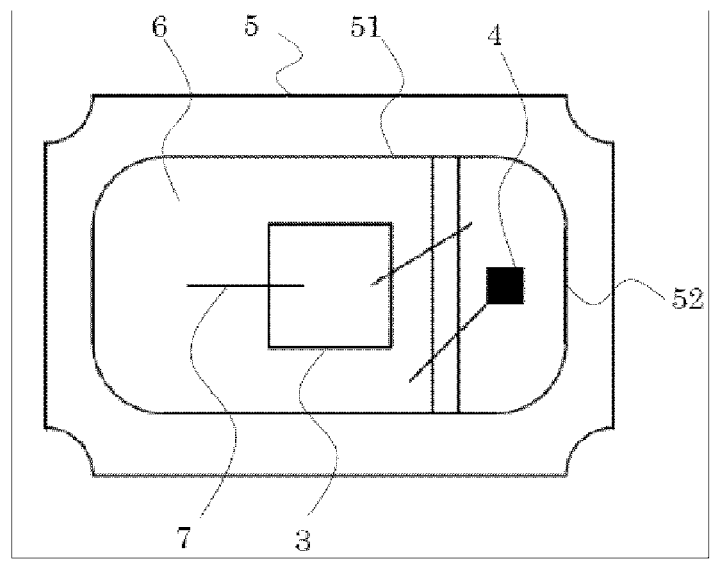
FIG. 1 is a top view for describing a method of manufacturing a light-emitting device according to one embodiment of the present invention.

In the following description, an embodiment for carrying out the present invention will be described with reference to the drawings. Note that the following embodiment is an illustration of a method of manufacturing a light-emitting device for embodying the technical idea of the present invention. The method of manufacturing a light-emitting device of the present invention is not limited to the described embodiment.

Further, the present specification is not intended to limit elements recited in the claims to the members shown in the described embodiment. The dimension, material, shape, relative disposition and the like of the components appearing in the embodiment are not intended to limit the range of the present invention thereto and they are merely examples, unless otherwise specified. Note that, the size and positional relationship of the members shown in the drawings may be exaggerated for the sake of clarity.

Figure 2:
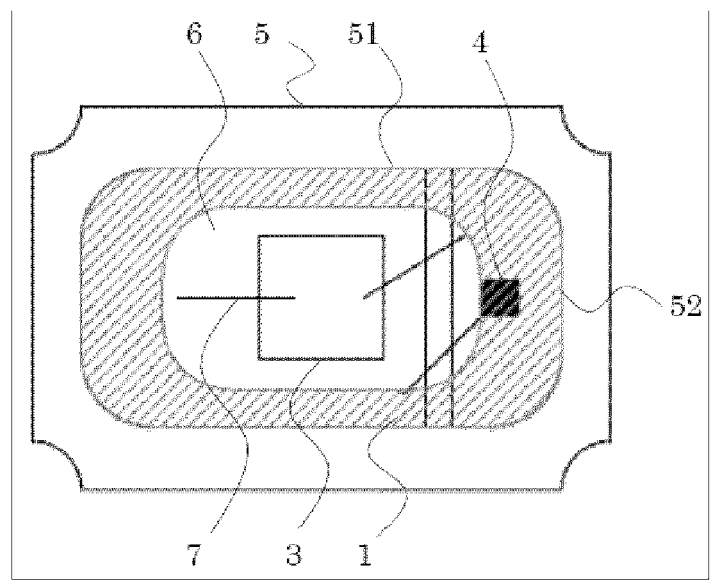
FIG. 2 is a top view for describing the method of manufacturing a light-emitting device according to one embodiment of the present invention.
Figure 3:
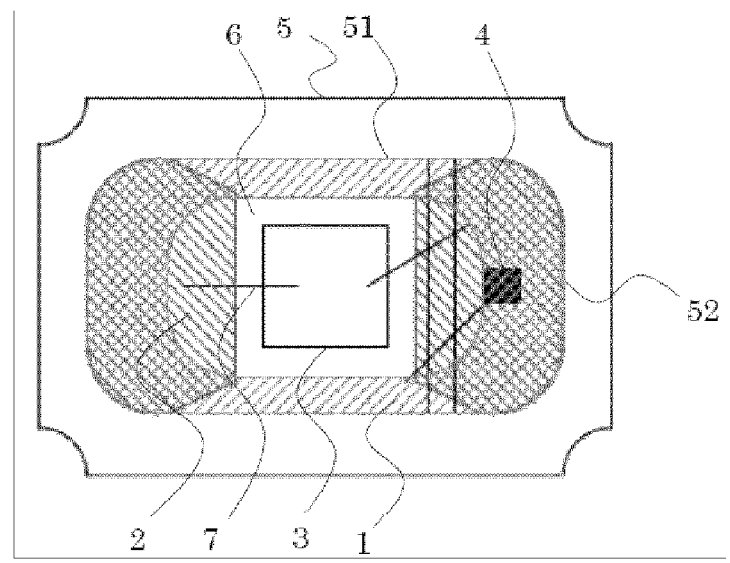
FIG. 3 is a top view for describing the method of manufacturing a light-emitting device according to one embodiment of the present invention.
Figure 4A:
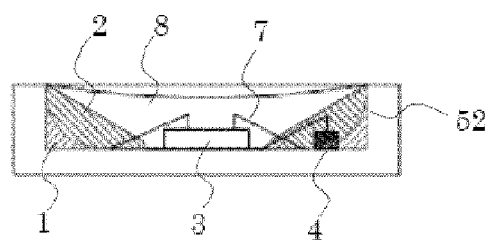
FIGS. 4A to 4C are cross-sectional views of a light-emitting device according to one embodiment of the present invention.
Figure 4B:
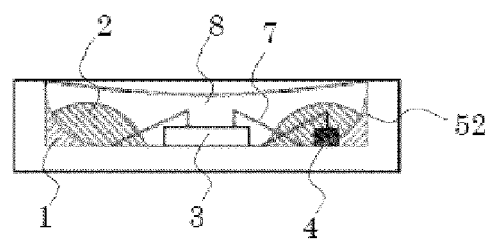
Figure 4C:
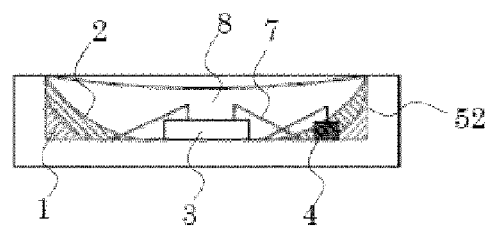

FIGS. 1 to 3 are top views for describing a method of manufacturing a light-emitting device according to one embodiment of the present invention. FIGS. 4A to 4C are cross-sectional views of a light-emitting device according to one embodiment of the present invention. As shown in FIGS. 1 to 4C, the method of manufacturing a light-emitting device according to one embodiment of the present invention is a method of manufacturing a light-emitting device in which a light-emitting element 3 is disposed at the bottom surface of a supporting member 5 having a recess and a light-reflecting wall is disposed around the light-emitting element 3 (the diagonally shaded area in FIG. 3). The present manufacturing method includes: providing the supporting member 5 having the recess as shown in FIG. 1; disposing the light-emitting element 3 at the bottom surface of the recess; disposing a first light-reflecting resin 1 at the bottom surface of the recess as shown in FIG. 2; disposing a second light-reflecting resin 2 being higher in viscosity than the first light-reflecting resin 1 at the recess as shown in FIG. 3; and curing the first light-reflecting resin 1 and the second light-reflecting resin 2 to form the light-reflecting wall.

In the present embodiment, using the first light-reflecting resin of low viscosity, a relatively wide region at the bottom surface of the recess can be covered with the light-reflecting resin. Further, using the second light-reflecting resin of high viscosity, the light-reflecting resin can be formed at a high position distanced from the bottom surface of the recess. As a result, a light-emitting device exhibiting high light extraction efficiency can be obtained. In the following, the structures of the present embodiment will be described in detail.

<Providing Supporting Member>

The supporting member 5 has the recess in which the light-emitting element 3 is disposed, and includes a wiring electrode 6 connected to the light-emitting element 3. Taking moisture resistance or light reflectivity into consideration, the surface of the wiring electrode 6 may be gold-plated or silver-plated. When the surface of the wiring electrode 6 is gold-plated, the surface of the gold plating is preferably covered with two types of light-reflecting resins 1 and 2, so as to prevent light from the light-emitting element 3 being absorbed by the gold plating.

The supporting member 5 may be a resin package or a ceramic package. When the supporting member 5 is a ceramic package, the recess is preferably covered with the light-reflecting resin according to the present embodiment, because ceramic has relatively high light transmissivity. The covering prevents leakage of light from the outer surface of the supporting member that is not the light-emitting surface of the light-emitting device.

The recess has an opening, of which a general shape as seen from the opening direction is a rectangle or a square. The corners of the rectangle or the square may be curved. Alternatively, the general shape of the opening may be an ellipse. When the general shape of the opening is a rectangle, as shown in FIG. 1, there are two pairs of regions that differ from each other in the distance between the light-emitting element 3 disposed at substantially the center of the bottom surface of the recess and the lateral surface of the recess. That is, the lateral surface of the recess is formed by two first regions 51 opposing to each other via the light-emitting element 3, and two second regions 52 opposing to each other, in the direction different from the two first regions 51, via the light-emitting element 3. The distance between the first regions 51 and the light-emitting element 3 is smaller than the distance between the second regions 52 and the light-emitting element 3. Here, the distance between the light-emitting element 3 and each region of the recess refers to the smallest distance between the lateral surface of the light-emitting element 3 and each region of the recess.

<Disposing Light-emitting Element and Others>

The light-emitting element 3 is disposed at the bottom surface of the recess of the supporting member 5. The light-emitting element 3 disposed at the supporting member 5 may be a semiconductor light-emitting element using a semiconductor. Further, when a sealing member 8 shown in FIGS. 4A to 4C contains a fluorescent material, a nitride-based semiconductor ($In_X Al_Y Ga_{1-X-Y} N$, $0 \leq X$, $0 \leq Y$, $X+Y \leq 1$) capable of emitting light of short wavelengths with which the fluorescent material can be efficiently excited is preferably used. However, the composition and color of emitted light of the semiconductor of the light-emitting element 3 are not limited to the foregoing, and can be selected as appropriate in accordance with the intended use. Further, the light-emitting element 3 can be formed by not just a light-emitting element that outputs light of visible light region, but by a light-emitting element that outputs ultraviolet rays or infrared rays.

The semiconductor element 4 other than the light-emitting element 3 may be a protective element such as a Zener diode or a transistor for controlling the light-emitting element 3. Such a semiconductor element 4 is disposed at the bottom surface of the recess at the position being distanced from the light-emitting element 3 to some extent, so as not to disadvantageously influence the light emission characteristic of the light-emitting element 3. As shown in FIG. 1, when the semiconductor element 4 is disposed at the periphery of the recess, a nozzle that discharges a light-reflecting resin may not easily reach near to semiconductor element 4. However, in such a case, the first light-reflecting resin 1 of relatively low viscosity and high flowability, which will be described later, can cover the semiconductor element 4 with ease. Further, the light-reflecting resin covering the semiconductor element 4 other than the light-emitting element 3 can prevent any disadvantageous influence on the light emission characteristic of the light-emitting device.

Disposing a light-emitting element may include performing wire bonding for connecting electrodes of the light-emitting element 3 and that of the semiconductor element 4 to the wiring electrode 6 of the supporting member 5 with wires 7. The material of the wires 7 may be selected from metal materials such as gold, silver, copper, and aluminum. Note that, in the case where the electrodes of the light-emitting element and that of the semiconductor element are connected to the wiring electrode, for example, using an electrically conductive material containing such a metal material, the wires are not essential.

When the material of the wires 7 contains a material that absorbs part of light from the light-emitting element 3, such as gold, at least part of the members is covered with the light-reflecting resin that will be described later. Because the light-reflecting resin can reflect light, the light extraction efficiency of the light-emitting device improves. Further, the work of covering is easier when part of the wires 7 is covered with the first light-reflecting resin 1 having relatively low viscosity and high flowability, which will be described later.

<Forming Light-reflecting Wall>

Forming a light-reflecting wall includes, after disposing the light-emitting element and other elements, disposing the first light-reflecting resin 1 having relatively low viscosity around the light-emitting element 3 as shown in FIG. 2, and disposing the second light-reflecting resin 2 being higher in viscosity than the first light-reflecting resin 1 around the light-emitting element 3 as shown in FIG. 3. These operations are described below.

The viscosity of the second light-reflecting resin 2, which will be described later, is adjusted to be high. Accordingly, the flowability of the second light-reflecting resin 2 is low, and consequently there may exist a portion in the recess where the light-reflecting resin is not easily disposed. Such a portion may be, for example, an edge formed between the lateral surface of the recess of the supporting member and the bottom surface, and a portion where the distance between the light-emitting element and the lateral surface of the recess is relatively small. In such a case also, the light-reflecting resin can be disposed over a wide region by discharging the light-reflecting resin having relatively low viscosity from a nozzle, and thereafter allowing the light-reflecting resin to spread exploiting the flowability of the light-reflecting resin. The viscosity of the first light-reflecting resin may be adjusted such that, for example, the first light-reflecting resin flows from the position where it is disposed at the bottom surface of the recess along the edge formed between the bottom surface and the lateral surface of the recess, to attain the state where the first light-reflecting resin surrounds the light-emitting element while covering the edge. The first light-reflecting resin 1 may be supplied by being discharged from a nozzle to the position between the light-emitting element 3 and the second regions 52 where spaces are relatively wide as shown in FIG. 1 and the light-reflecting resin can be easily disposed, and thereafter the first light-reflecting resin 51 may be caused to extend between the light-emitting element 3 and the first regions 51 where spaces are relatively small and the light-reflecting resin is not easily disposed, exploiting the flowability attributed to the surface tension of the light-reflecting resin.

The viscosity of the first light-reflecting resin 1 is preferably adjusted so that the first light-reflecting resin 1 does not flow to creep up along the light-emitting element 3 and keeps a proper interval from the lateral surface of the light-emitting element 3. The viscosity of the first light-reflecting resin 1 may be, for example, from 1 Pa·s to 20 Pa·s inclusive. The light-reflecting resin being prevented from creeping up along the light-emitting surface of the light-emitting element 3 prevents a reduction in light extraction efficiency due to the light-reflecting resin covering the light-emitting element 3.

For the purpose of disposing the light-reflecting resin as wide as possible in the recess, the viscosity is desirably relatively low so that the flowability of the first light-reflecting resin 1 improves. On the other hand, excessively low viscosity excessively increases the flowability, and disadvantageously can allow the first light-reflecting resin 1 be in contact with the light-emitting element 3. Therefore, there may be cases where the first light-reflecting resin 1 is restricted, to some extent, from spreading in the recess. Disposing the second light-reflecting resin 2 around the light-emitting element 3 involves disposing the second light-reflecting resin 2 at a position where the first light-reflecting resin 1 has been insufficiently disposed. Further, disposing the second light-reflecting resin 2 also involves disposing the light-reflecting resin having increased viscosity to some extent for forming a light-reflecting wall around the light-emitting element 3. The light-reflecting wall must be formed into a shape with which light from the light-emitting element 3 is reflected and extracted outside the light-emitting device. In order for the light-reflecting wall to be capable of keeping such a shape in advance of curing of the resin, the viscosity of the second light-reflecting resin 2 must be raised to some extent so as to prevent the shape of the light-reflecting wall from being lost due to flowing of the resin.

The viscosity of the second light-reflecting resin 2 may be, for example, from 20 Pa·s and to 500 Pa·s inclusive, and preferably from 30 Pa·s to 60 Pa·s inclusive. The shape formed by the second light-reflecting resin 2 should be appropriately specified, so long as it is suitable for reflecting light from the light-emitting element 3 to be extracted outside the light-emitting device. In the shape of the light-reflecting wall, for example as shown in FIGS. 4A to 4C, the surface exposed at the recess of the supporting member 5 may be an outwardly convex curved surface (FIG. 4B), a concave curved surface (FIG. 4C), or a flat inclined surface (FIG. 4A). Preferably, by curing the second light-reflecting resin 2, the light-reflecting wall higher than the light-emitting element 3 is formed. This improves the light extraction efficiency of the light-emitting device. Further, the second light-reflecting resin 2 can also be shaped by disposing the second light-reflecting resin 2 at the recess and thereafter pressing a mold against the second light-reflecting resin 2.

The order of performing the disposing the first light-reflecting resin 1 and the disposing the second light-reflecting resin 2 may be selected as appropriate, taking work efficiency into consideration. Further, curing the first light-reflecting resin 1 and curing the second light-reflecting resin 2 may be performed simultaneously or separately. Preferably, the first light-reflecting resin 1 is disposed and partially cured in advance so as to prevent the light-reflecting resin having high flowability and low viscosity from covering the light-emitting surface of the light-emitting element 3, and thereafter the second light-reflecting resin 2 is disposed and cured.

The disposition of the light-reflecting resins can be performed by discharging liquid resin from a nozzle at a tip of a resin discharging apparatus containing the first or second light-reflecting resin 1, 2 toward the bottom surface of the recess of the supporting member 5. For example, this can be carried out using a resin discharging apparatus shiftable in the vertical direction or the horizontal direction relative to the fixed supporting member 5. Alternatively, it can be carried out by shifting the supporting member in the vertical direction or the horizontal direction relative to the fixed resin discharging apparatus. That is, by relatively shifting the supporting member 5 and the resin discharging apparatus while discharging a liquid resin from a nozzle at a tip of a resin discharging apparatus containing the resin, the light-reflecting resin can be disposed around the light-emitting element 3 while changing the disposing position. By intermittently or continuously discharging the light-reflecting resin from the resin discharging apparatus, the light-reflecting resin can be disposed at a plurality of spots in the recess or linearly disposed in the recess. The first light-reflecting resin and the second light-reflecting resin can be disposed in the recess using the same resin discharging apparatus and interchanging the first light-reflecting resin 1 and the second light-reflecting resin 2, or using different resin discharging apparatuses respectively for the first light-reflecting resin 1 and the second light-reflecting resin 2.

The light-reflecting wall formed by the light-reflecting resin contains filler for adjusting viscosity or a light diffusing material for reflecting light. By being disposed around the light-emitting element 3, the light-reflecting wall reflects light from the light-emitting element 3 to the outside of the light-emitting device. The light-reflecting wall is formed by a light-reflecting resin, which may be, for example, silicone resin, epoxy resin or the like. Further, the light-reflecting resin contains, in such types of resin, filler mainly intended to adjust viscosity and a light diffusing material. The material of the filler and the light diffusing material may be, for example, $TiO_2$, $Al_2O_3$, $ZrO_2$, MgO or the like. Further, by adjusting the particle size and the concentration relative to the resin of the filler and the light diffusing material, and also by the characteristic of the material of the resin itself, the viscosity of the whole light-reflecting resin can be adjusted. The particle size of the filler may be from 5 nm to 20 nm inclusive, and the concentration relative to the resin may be from 3 wt % to 8 wt % inclusive. Further, the particle size of the light diffusing material may be from 160 nm to 4000 nm inclusive. The concentration relative to the resin may be from 30 wt % to 60 wt % inclusive.

<Forming Sealing Member>

Forming a sealing member is, as shown in FIG. 4, forming the sealing member 8 so as to cover the light-emitting element 3 and the wires 7 in the recess of the supporting member 5. That is, the sealing member 8 is formed by injecting resin into the recess so as to cover the light-emitting element 3 and the wires 7, and thereafter curing the resin.

The sealing member 8 is a member for protecting the light-emitting element 3 and the wires 7 disposed in the recess from dust, moisture, external force and the like, and can be dispensed with as necessary. The sealing member 8 is formed by causing the recess of the supporting member 5 to be filled with the material of the sealing member 8 so that the material covers the light-emitting element 3, the wires 7, and the light-reflecting wall.

The material of the sealing member 8 preferably exhibits high light transmissivity. A specific material may be silicone resin, epoxy resin or the like. Further, to such a material, a coloring agent, a light diffusing agent, filler and the like may be added as desired.

The sealing member 8 may contain a fluorescent material that absorbs at least part of light from the light-emitting element 3 and emits light of a different wavelength. A specific material of the fluorescent material may be, for example, a YAG-based fluorescent material, a nitride-based fluorescent material or an oxynitride-based fluorescent material which are mainly activated by lanthanoid series such as Eu, Ce and the like.

EXAMPLE 1

An Example of the present invention will be described in detail below. Note that, it goes without saying that the present invention is not limited to the following Example.

FIGS. 1 to 3 are top views for describing the steps in the method of manufacturing a light-emitting device according to the present embodiment in order. FIG. 4B is a cross-sectional view of the light-emitting device according to the present embodiment. As shown in FIGS. 3 and 4B, the light-emitting device according to the present embodiment includes the supporting member 5 having the recess, the light-emitting element 3 disposed at the bottom surface of the recess, a Zener diode 4 disposed beside the light-emitting element 3, the light-reflecting wall (the diagonally shaded area in FIG. 3) formed around the light-emitting element 3, and the sealing member 8 formed over these members.

The main material of the supporting member 5 is alumina. The supporting member 5 is formed by layering ceramic sheets of various shapes so as to form the recess, and firing the sheets. At the bottom surface of the recess, the wiring electrode 6 is provided, of which an upper surface is gold-plated. The wiring electrode 6 is connected to the electrodes of the light-emitting element 3 and that of the Zener diode 4 with the wires 7 at the bottom surface of the recess. The wiring electrode 6 is extended to the lower surface of the supporting member and capable of being connected to an external electrode. In this manner, the light-emitting device according to the present embodiment is structured by members that contain materials that easily absorb or transmit light of the light-emitting element 3. Forming the light-reflecting wall having high reflectivity at the light-emitting device of such a structure provides a light-emitting device that exhibits high light extraction efficiency with reduced light absorption or transmission.

The light-emitting element 3 is a nitride-based semiconductor light-emitting element of which light emission peak wavelength is about 450 nm. The sealing member 8 is formed by silicone resin containing a YAG-based fluorescent material. The YAG-based fluorescent material emits light in response to light from the light-emitting element 3, whereby the light-emitting device can emit light of mixed color derived from light from the light-emitting element 3 and light from the YAG-based fluorescent material. The method of manufacturing a light-emitting device according to the present embodiment will be detailed below.

The light-emitting element is bonded to the bottom surface of the recess of the supporting member with AuSn eutectic paste. As shown in FIGS. 1 to 3, the general shape of the opening and the bottom surface of the recess formed at the supporting member 5 according to the present embodiment is, as seen from the opening direction, a rectangle having a lateral length of about 1.35 mm and a longitudinal length of about 2.5 mm. When the light-emitting element of which outer shape is a square of 650 μm×650 μm with a thickness of 150 μm is disposed substantially at the center of the recess so that the sides of the square are respectively in parallel to the sides of the rectangle, the lateral surface of the recess includes two first regions 51 opposing to each other via the light-emitting element 3, and two second regions 52 opposing to each other via the light-emitting element, the two second regions 52 being in the direction displaced by 90° from the two first regions 51. Here, the distance between each first region 51 and the lateral surface of the light-emitting element 3 is about 0.35 mm, which is smaller by about 0.57 mm than the distance between each second region 52 and the light-emitting element 3, which is about 0.92 mm.

As shown in FIG. 1, the Zener diode 4 is disposed beside the light-emitting element 3, and thereafter the electrodes of the light-emitting element 3 and that of the Zener diode 4 are connected to the wiring electrode 6 with gold wires 7.

The first light-reflecting resin 1 is provided. The first light-reflecting resin 1 contains, in silicone resin (viscosity: 4.5 Pa·s), titanium dioxide (particle size: 250 nm) by a concentration of 30 wt % relative to the silicone resin. The viscosity of the first light-reflecting resin 1 is adjusted to 6.0 Pa·s.

This first light-reflecting resin 1 is disposed twice in a dotted manner using a resin discharging apparatus respectively at two spaces (respective centers of the spaces are distanced by about 400 nm from the second regions 52) formed between the light-emitting element 3 and the second regions 52 of the recess. The first light-reflecting resin 1 has high flowability. By the influence of surface tension of the first light-reflecting resin 1, the first light-reflecting resin 1 partially flows out from the spaces formed between the light-emitting element 3 and second regions 52 toward the spaces formed between the light-emitting element 3 and the first regions 51 along the edge of the recess. Ultimately, the first light-reflecting resin 1 spreads to surround the light-emitting element 3 while keeping a distance from the lateral surface of the light-emitting element 3. Further, the Zener diode 4 and part of the wires are also covered with the first light-reflecting resin 1. The first light-reflecting resin 1 spreads over time after disposition. Accordingly, the first light-reflecting resin 1 is left for a while thereby allowed to spread to reach a predetermined position, where the first light-reflecting resin 1 is timely partially cured. FIG. 2 is a top view showing the state where the first light-reflecting resin 1 has been disposed.

The second light-reflecting resin 2 is provided similarly to the first light-reflecting resin 1, except that silicon dioxide having a particle size of 12 nm as filler is contained by 5 wt % relative to the silicone resin. The viscosity of the second light-reflecting resin 2 is adjusted to 30 Pa·s.

This second light-reflecting resin 2 is disposed twice in a dotted manner using a resin discharging apparatus respectively at two spaces (respective centers of the spaces are distanced by about 500 nm from the second regions) formed between the light-emitting element 3 and the second regions 52 being the lateral surface of the recess, so as to cover part of the first light-reflecting resin 1 and the Zener diode 4. The second light-reflecting resin 2 is lower than the first light-reflecting resin 1 in wettability of liquid resin relative to the bottom surface and the lateral surface of the recess, and the angle of contact thereof is relatively small. Accordingly, after disposition of the second light-reflecting resin 2, the shape of the second light-reflecting resin 2 keeps a convex shape projecting toward the opening direction of the recess in a cross section taken in parallel to the first regions 51. In this manner, the second light-reflecting resin is disposed, and thereafter partially cured. FIG. 3 is a top view showing the state where the second light-reflecting resin 2 has been disposed. Further, FIG. 4B is a cross-sectional view corresponding to FIG. 3.

As the material of the sealing member 8, a mixture of silicone resin and a YAG-based fluorescent material is prepared. The recess of the supporting member 5 is filled with the mixture so that the mixture covers the light-emitting element 3, the first light-reflecting resin 1 and the second light-reflecting resin 2.

By curing the first light-reflecting resin 1, the second light-reflecting resin 2, and the resin of the sealing member 8, the light-reflecting wall is formed between the first regions 51 and the light-emitting element 3 and between the second regions 52 and the light-emitting element 3, and the sealing member 8 is formed over these elements. The upper end of the light-reflecting wall being the first light-reflecting resin 1 and the second light-reflecting resin 2 reaches the upper surface of the supporting member, and the height of the light-reflecting wall from the bottom surface of the recess is about 400 μm. Further, the height of the light-emitting element from the bottom surface of the recess is about 150 μm. Further, the inner end of the light-reflecting wall formed by the first light-reflecting resin 1 and the second light-reflecting resin 2 is spaced apart from the lateral surface of the light-emitting element, at a portion where the distance is small, by about 0.15 mm. Hence, the light-reflecting resin does not cover the light-emitting surface of the light-emitting element. Further, the surface of the light-reflecting wall formed by the cured second light-reflecting resin, that is, the surface of the light-reflecting wall exposed at the recess, is an outwardly convex curved surface.

The light-emitting device formed in this manner shows an improvement of about 24% in luminous flux as compared to a light-emitting device that is formed similarly to the light-emitting device according to the present embodiment except that the light-reflecting wall is not included. Further, the light-emitting device formed in this manner shows an improvement of about 7% in luminous flux as compared to a light-emitting device that is formed similarly to the light-emitting device according to the present embodiment except that a light-reflecting wall formed by a second light-reflecting resin is not included and only a light-reflecting wall formed by the first light-reflecting resin is included.

Certain embodiments of the present invention can be suitably used as a method of manufacturing a light-emitting device exhibiting high light extraction efficiency.

DENOTATION OF REFERENCE NUMERALS 1 first light-reflecting resin
2 second light-reflecting resin
3 light-emitting element
4 semiconductor element
5 supporting member
6 wiring electrode
7 wire
8 sealing member
51 first region
52 second region

What is claimed is:

1. A method of manufacturing a light-emitting device, the method comprising:
   providing a supporting member having an upward-facing surface and an inner lateral surface that defines a recess, the upward-facing surface being located at a bottom of the recess, and the inner lateral surface extending laterally around the recess;
   disposing a light-emitting element on the upward-facing surface of the supporting member;
   disposing a first light-reflecting resin in the recess so as to directly contact the upward-facing surface of the supporting member at the bottom of the recess and directly contact the inner lateral surface of the supporting member extending laterally around the recess;
   disposing a second light-reflecting resin in the recess so as to directly contact the upward-facing surface of the supporting member at the bottom of the recess and directly contact a surface of the first light-reflecting resin, wherein a viscosity of the second light-reflecting resin is higher than a viscosity of the first light-reflecting resin; and
   curing the first light-reflecting resin and the second light-reflecting resin to form a light-reflecting wall.

2. The method of manufacturing a light-emitting device according to claim 1, wherein:
   the inner lateral surface of the supporting member is formed by two first regions opposing each other in a first direction and two second regions opposing each other in a second direction differing from the first direction,
   a distance between each of the first regions and the light-emitting element is smaller than a distance between each of the second regions and the light-emitting element,
   the first light-reflecting resin is disposed between the first regions and the light-emitting element and between the second regions and the light-emitting element, and
   the second light-reflecting resin is disposed between the second regions and the light-emitting element.

3. The method of manufacturing a light-emitting device according to claim 2, wherein the first light-reflecting resin is supplied between the second regions and the light-emitting element, and thereafter, the first light-reflecting resin is allowed to extend between the first regions and the light-emitting element.

4. The method of manufacturing a light-emitting device according to claim 1, wherein the first light-reflecting resin and the second light-reflecting resin are disposed so as to be spaced apart from the light-emitting element.

5. The method of manufacturing a light-emitting device according to claim 1, wherein a semiconductor element differing from the light-emitting element is disposed at the bottom surface of the recess, and thereafter, the semiconductor element is covered with the first light-reflecting resin.

6. The method of manufacturing a light-emitting device according to claim 1, wherein the supporting member includes a gold-plated wiring electrode at the bottom surface of the recess.

7. The method of manufacturing a light-emitting device according to claim 2, wherein an electrode of the light-emitting element is connected to the wiring electrode with a wire, and thereafter, at least part of the wire is covered with the first light-reflecting resin.

8. The method of manufacturing a light-emitting device according to claim 1, wherein the second light-reflecting resin is cured to form the light-reflecting wall, and a height of the light-reflecting wall is greater than a height of the light-emitting element.

9. The method of manufacturing a light-emitting device according to claim 1, wherein the first light-reflecting resin and the second light-reflecting resin contain a light diffusing material.

10. The method of manufacturing a light-emitting device according to claim 1, wherein a concentration of filler in the second light-reflecting resin is higher than a concentration of filler in the first light-reflecting resin.

11. The method of manufacturing a light-emitting device according to claim 1, wherein the supporting member is a ceramic package.

* * * * *